(12) United States Patent
Samples et al.

(10) Patent No.: US 10,522,443 B2
(45) Date of Patent: Dec. 31, 2019

(54) LID COVER SPRING DESIGN

(71) Applicant: Microsemi Corporation, Bend, OR (US)

(72) Inventors: Benjamin A. Samples, Bend, OR (US); John Fredrick May, Bend, OR (US)

(73) Assignee: MICROSEMI CORPORATION, Chandler, AZ (US)

( * ) Notice: Subject to any disclaimer, the term of this patent is extended or adjusted under 35 U.S.C. 154(b) by 0 days.

(21) Appl. No.: 15/967,605

(22) Filed: May 1, 2018

(65) Prior Publication Data
US 2018/0350716 A1 Dec. 6, 2018

Related U.S. Application Data

(60) Provisional application No. 62/515,261, filed on Jun. 5, 2017.

(51) Int. Cl.
*H01L 23/40* (2006.01)
*H01L 23/367* (2006.01)
(Continued)

(52) U.S. Cl.
CPC ...... *H01L 23/4006* (2013.01); *H01L 23/3675* (2013.01); *H01L 23/562* (2013.01);
(Continued)

(58) Field of Classification Search
CPC . H01L 23/4006; H01L 25/50; H01L 23/3675; H01L 23/562; H01L 2023/4087; H01L 2023/405
See application file for complete search history.

(56) References Cited

U.S. PATENT DOCUMENTS 7,535,173 B2 *  5/2009  Kim .................. H05K 5/02
                                             313/582
7,675,167 B2 *  3/2010  Schlomann ......... H01L 23/4006
                                             257/704

(Continued)

OTHER PUBLICATIONS

Locher; "IXAN0029 New Packages for Pressure Mounting"; published by IXYS Corporation, Santa Clara, CA.
(Continued)

*Primary Examiner* — Charles D Garber
*Assistant Examiner* — S M Sohel Imtiaz
(74) *Attorney, Agent, or Firm* — Glass and Associates; Kenneth Glass

(57) ABSTRACT

A module package can include a substrate; at least one device component configured to be positioned on the substrate; a module package lid configured to be positioned over the at least one device component and on the substrate, the module package lid exhibiting a plateau portion; and at least one mounting spring configured to be positioned on the module package lid, wherein the at least one mounting spring is configured to be mechanically coupled with a mounting surface and further positionally secure the module package lid and the at least one device component. Each mounting spring can include a middle portion; an end portion having a mounting hole; and a curved section between the middle portion and the end portion, the middle portion arranged to mate with the plateau portion of the module package lid when the end portion are secured to the substrate, the curved section being configured to prevent contact with a first corner portion of the module package lid.

7 Claims, 11 Drawing Sheets

(51) Int. Cl.
*H01L 23/00* (2006.01)
*H01L 25/00* (2006.01)
(52) U.S. Cl.
CPC ........ *H01L 25/50* (2013.01); *H01L 2023/405* (2013.01); *H01L 2023/4087* (2013.01)

(56) References Cited

U.S. PATENT DOCUMENTS

| | | | |
|---|---|---|---|
| 7,719,841 B2* | 5/2010 | Yamashita | H01L 23/4006 165/185 |
| 8,034,666 B2 | 10/2011 | Samples | |
| 8,410,601 B2* | 4/2013 | Samples | H01L 23/057 257/696 |
| 9,947,560 B1* | 4/2018 | Mardi | H01L 21/4817 |
| 2006/0044764 A1* | 3/2006 | Kuang | G06F 1/183 361/710 |
| 2006/0279934 A1* | 12/2006 | Schlomann | H01L 23/4006 361/704 |
| 2007/0096297 A1 | 5/2007 | Frey | |
| 2007/0194444 A1* | 8/2007 | Peng | H01L 23/32 257/726 |
| 2009/0008771 A1* | 1/2009 | Torii | H01L 23/3675 257/713 |
| 2012/0222836 A1* | 9/2012 | Huang | F28D 15/02 165/67 |
| 2017/0170030 A1* | 6/2017 | Iruvanti | H01L 21/4853 |
| 2018/0056598 A1* | 3/2018 | Kuczynski | B29C 35/0805 |

OTHER PUBLICATIONS

Supergrip Heat Sink Attachment data sheet, published by Advance Thermal Solutions, Inc., Norwood, MA.

* cited by examiner

LID COVER SPRING DESIGN

TECHNICAL FIELD

The disclosed technology pertains generally to power modules and more specifically to power module packages.

BACKGROUND OF THE INVENTION

In order for a typical power electronics module to operate at working power levels, it is critical that the module's package be mounted to a temperature-controlled surface that can facilitate the removal of the resulting heat that will be generated. The mounting procedure for this installation generally requires that a package substrate and mounting plate meet flatness requirements, that the materials meet certain physical property requirements, that a sufficient thermal interface material is applied, and that the package be mounted with uniform and appropriate force.

In power electronics packages, it is common for the thermal interfaces to require 80 to 125 pounds-per-square-inch of pressure to ensure optimal performance. In order to achieve this pressure, screws are typically torqued (e.g., rotated by a screwdriver), which applies force at the mounting location. This force results in a pressure across the entire mounting area of the device. Unfortunately, the resultant pressure may not be uniformly applied.

A simple design, such as that illustrated by the prior art radio frequency (RF) power amplifier 100 of FIG. 1, can result in an installation where pressure is higher near the mounting holes 104A-D than in other locations on the bottom of the package. Further, such systems generally provide no safeguards against over-tightening of the package, which can result in any of a number of negative results such as plastic deformation or strain, for example. Indeed, it is very easy—and common—for a user to over-tighten a screw, thus causing damage.

Thus, there is a need in the art for a module package that can provide a solution to these problems.

SUMMARY OF THE INVENTION

It is, therefore, an object of the invention to create a module package that combines the benefits of mounting module packages by screws, e.g., providing accurate positioning of the package on a heat sink, with the advantages of mounting module packages by clamps, e.g., providing improved mounting pressure on the package.

As used herein, the term package generally refers to an assembly of components, e.g., a multi-chip module or other type of hybrid module, rather than injection-molded discrete devices, for example. An example of such a module is a radio frequency (RF) power module.

In certain implementations, one or more mounting springs may be used in connection with a lid and/or cover for an RF power module to secure the RF power module to a desired location and/or positioning, such as on a water-cooled high-thermal-capacity high-performance heat sink, for example.

It will be appreciated that packages in accordance with the disclosed technology may be modified and/or adapted for use by any of a number of different suitable devices such as electronic components, for example.

The foregoing and other objects, features and advantages of the invention will become more readily apparent from the following detailed description, which proceeds with reference to the accompanying drawings.

DETAILED DESCRIPTION

Implementations of the disclosed technology generally include the use of one or more lid cover springs in order to achieve the required mounting force for a power electronics package. FIGS. 2A-E and 3A-E illustrate two respective examples of such implementations.

Figure 1:
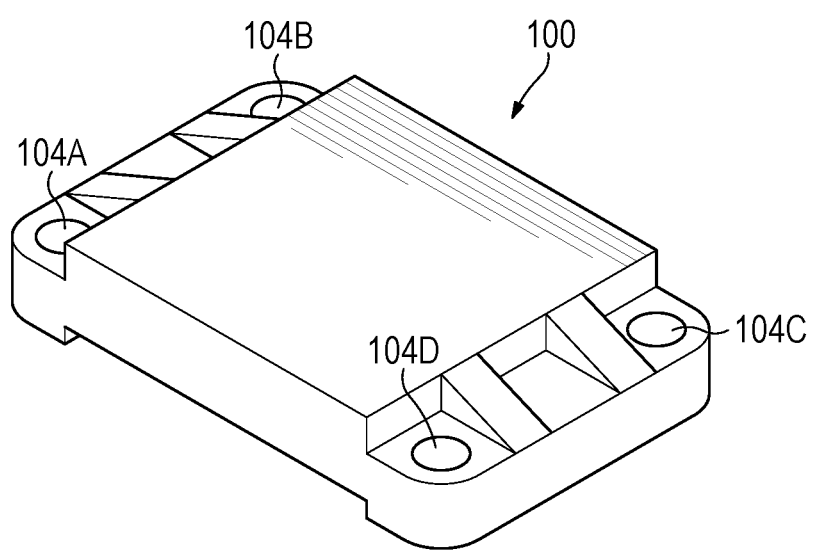
FIG. 1 is an example of a prior art radio frequency (RF) power amplifier having mounting holes.
Figure 2A:
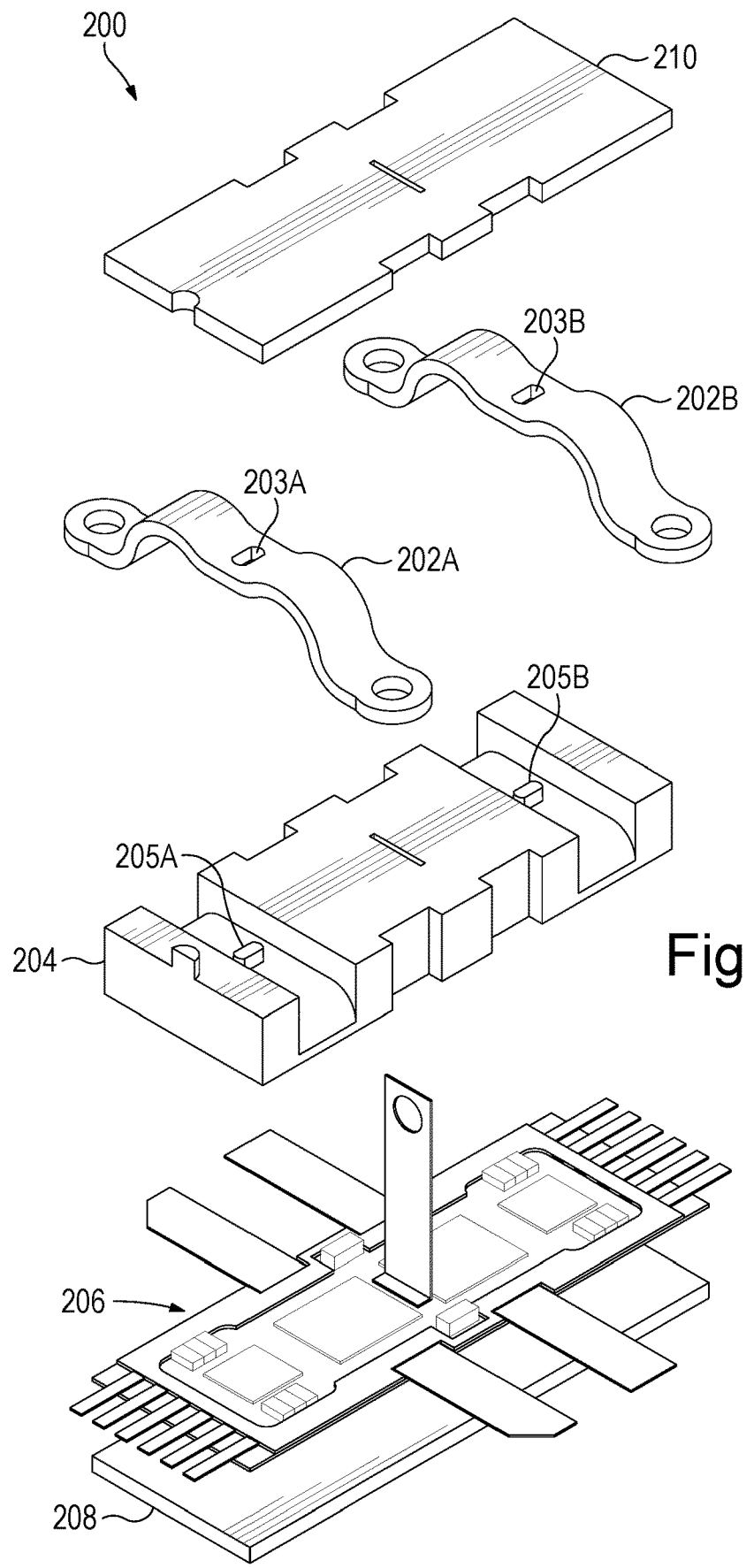
FIG. 2A illustrates a perspective exploded view of a power amplifier having mounting springs in accordance with certain implementations of the disclosed technology.

FIG. 2A illustrates a perspective exploded view of a power amplifier 200 having two mounting springs 202A-B in accordance with the disclosed technology. In the example, the power amplifier includes a substrate 208, multiple device components 206 (e.g., integrated circuits (ICs), connecting components, and electrical pathways), a module package lid 204, and the mounting springs 202A-B.

In the example, the mounting springs 202A-B have alignment holes 203A-B, respectively, that can be configured to respectively receive alignment pins 205A-B that are integrated with or otherwise attached to the module package lid 204. Such arrangement may be used to advantageously ensure that the mounting springs 202A-B are situated or otherwise positioned, and remain so, at the desired locations.

Figure 2B:
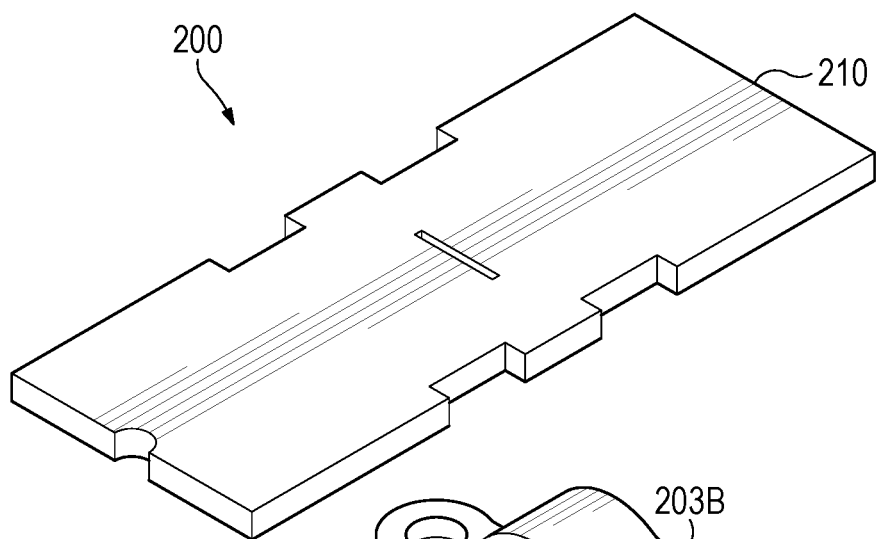
FIG. 2B illustrates a perspective partially assembled view of the power amplifier of FIG. 2A in accordance with certain implementations of the disclosed technology.
Figure 2B:
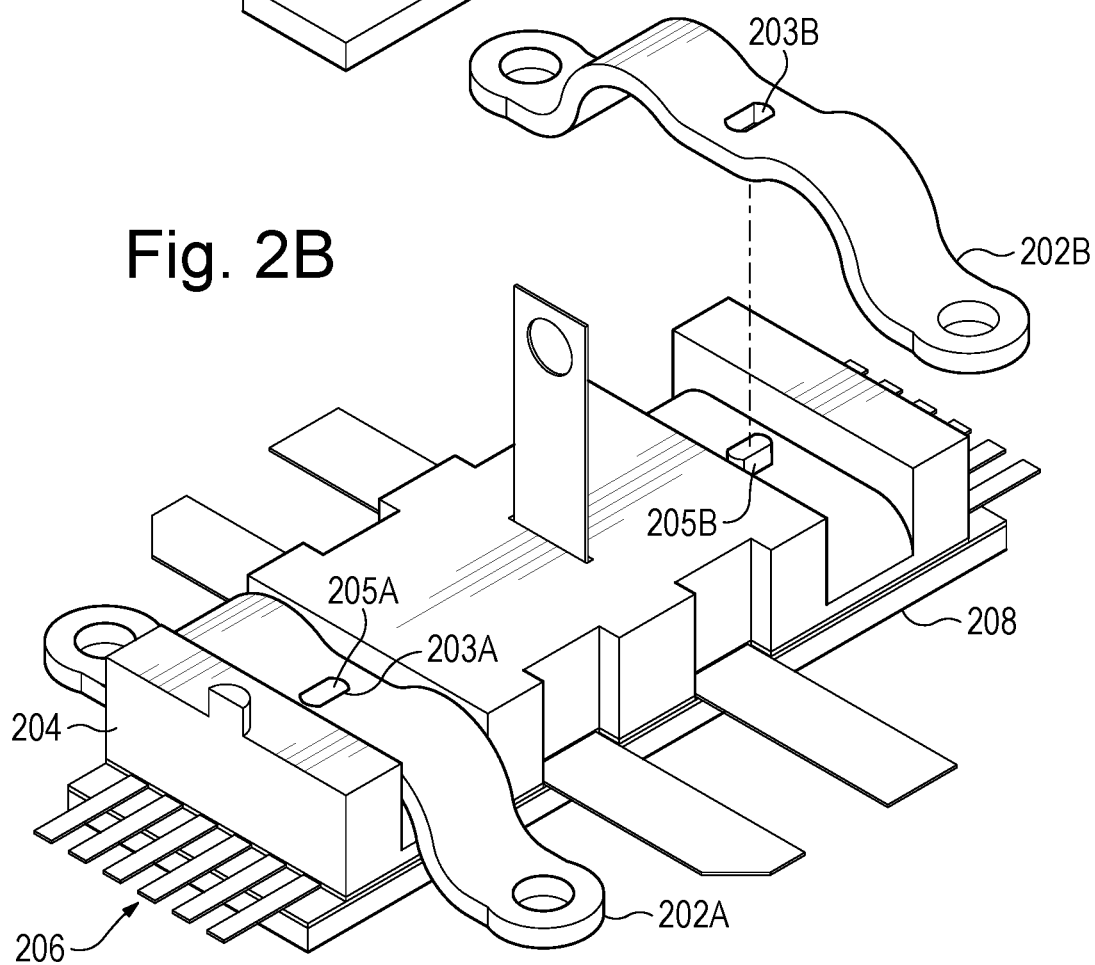

FIG. 2B illustrates a perspective partially assembled view of the power amplifier 200 having mounting springs 202A-B in accordance with the disclosed technology. In the example, the substrate 208 is positioned on a surface or location (not shown) to which the power amplifier is to be mounted, the device components 206 are positioned on the substrate 208, the module package lid 204 is positioned over the device components 206 and the substrate 208, the mounting springs 202A-B are positioned over the module package lid 204, and a cover 210 is positioned over all of the components.

Figure 2C:
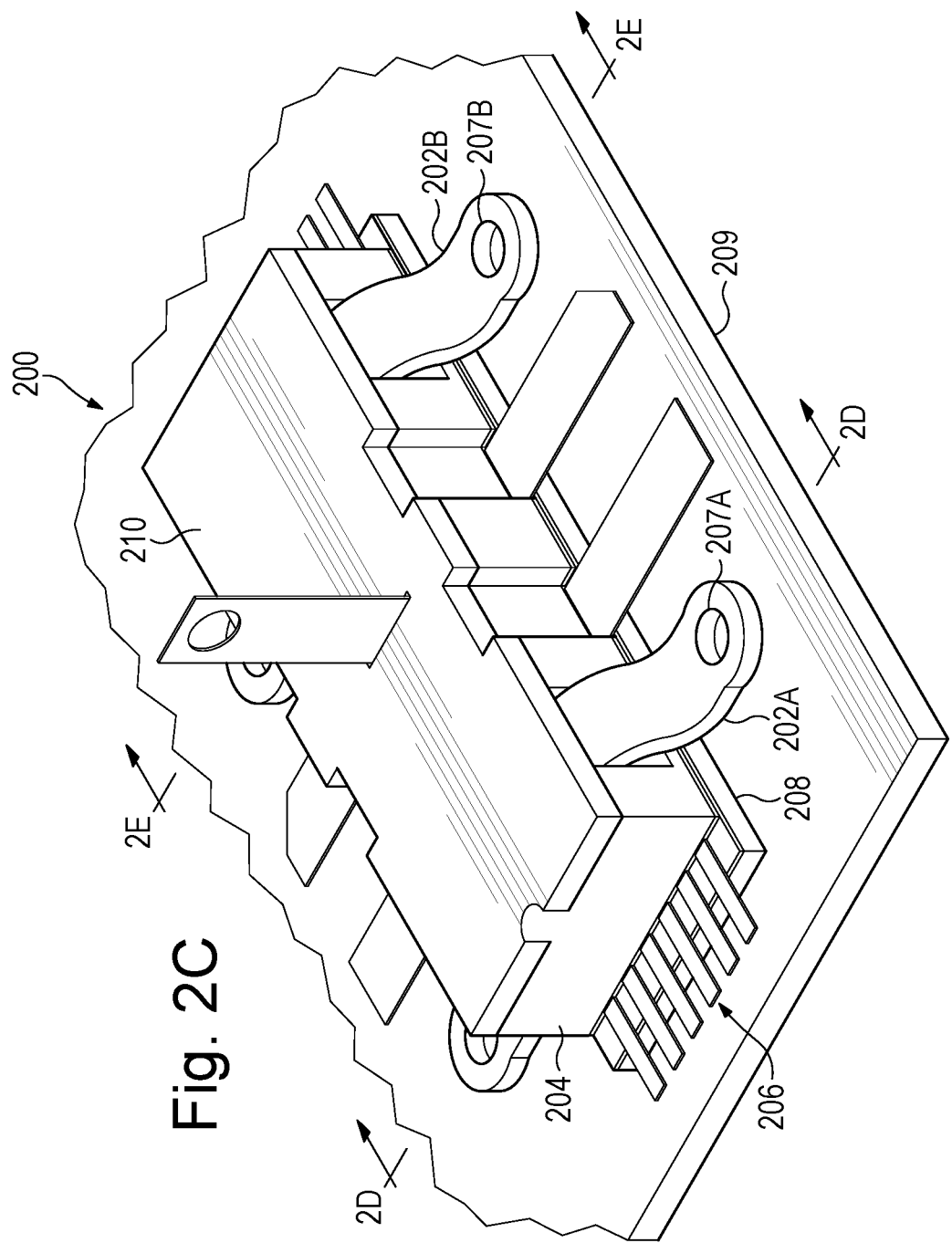
FIG. 2C illustrates a perspective assembled view of the power amplifier of FIGS. 2A-B in accordance with certain implementations of the disclosed technology.

FIG. 2C illustrates a perspective assembled view of the power amplifier 200 of FIGS. 2A-B. In the example, the mounting springs 202A-B may be coupled with the surface 209 by way of screws (not shown) inserted through mounting holes, such as mounting holes 207A-B, in corresponding end portions of the mounting springs 202A-B, respectively, for example. The end portions of the mounting springs 202A-B are arranged to be parallel with an upper surface of substrate 208 when the respective screws are inserted through mounting holes 207A-B and tightened. In this manner, the mounting springs 202A-B advantageously provide the benefits of mounting module packages by screws, e.g., maintaining positioning of the package on a heat sink by preventing lateral movement, as well as the advantages of mounting module packages by clamps, e.g., providing improved mounting pressure on the package. Advantageously, over-tightening of the respective screws does not result in plastic deformation of module package lid 204, since any overtightening results in attempt to deform the local portion of mounting springs 202A-B and/or the respective portion of substrate 208.

Figure 2D:
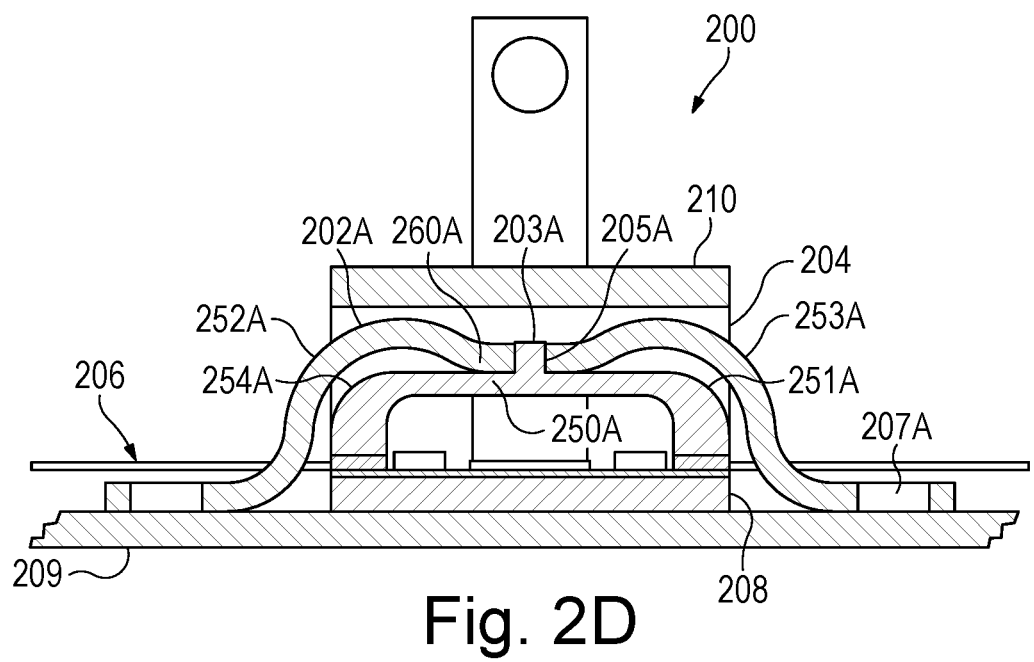
FIG. 2D illustrates a first cross-sectional assembled view of the power amplifier of FIGS. 2A-C in accordance with certain implementations of the disclosed technology.

FIG. 2D illustrates a first cross-sectional assembled view of the power amplifier 200 of FIGS. 2A-C in accordance with certain implementations of the disclosed technology. In the example, the first mounting spring 202A has two curved sections 252A and 253A that are each between a corresponding end portion and a middle valley portion 260A of the first mounting spring 202A. Both curved sections 252A and 253A are configured to avoid contact with curved corner portions 251A and 254A of the module package lid 204 when the first mounting spring 202A is coupled with the module package lid 204. The curved sections 252A and 253A of the mounting springs 202A may also be referred to as stress arches. Valley portion 260A of the first mounting spring 202A is arranged to be in contact with plateau portion 250A of the module package lid 204 when the first mounting spring 202A is coupled with the module package lid 204.

Figure 2E:
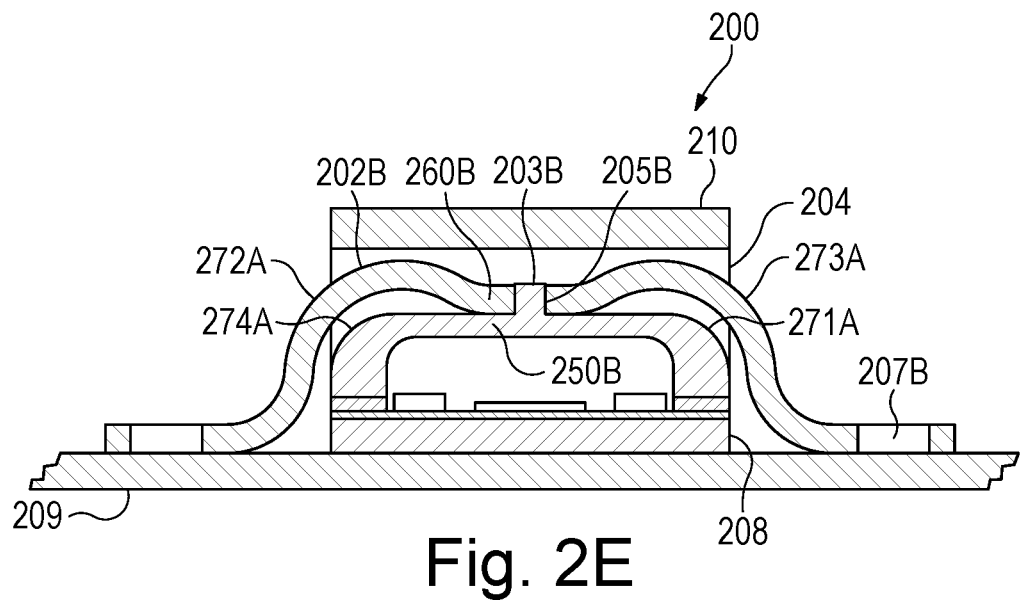
FIG. 2E illustrates a second cross-sectional assembled view of the power amplifier of FIGS. 2A-D in accordance with certain implementations of the disclosed technology.

FIG. 2E illustrates a second cross-sectional assembled view of the power amplifier 200 of FIGS. 2A-D in accordance with certain implementations of the disclosed technology. In the example, the second mounting spring 202B has two curved sections 272A and 273A (also referred to as stress arches) that are each between a corresponding end portion and a middle valley portion 260B of the second mounting spring 202B. Both curved sections 272A and 273A are configured to avoid contact with curved corner portions 271A and 274A of the module package lid 204 when the second mounting spring 202B is coupled with the module package lid 204.

As mounting screws are tightened through mounting holes 207A and 207B in the corresponding end portions of the mounting springs 202A and 202B, for example, the force of tightening is first transferred to the respective valley portions 260A and 260B which mate with the respective plateau sections 250A and 250B. Curved sections 253A and 273A of the mounting springs 202A and 202B may expand, contract, and/or absorb the energy resulting from the tightening, thus ensuring that the curved sections 253A and 273A of the mounting springs 202A and 202B do not come into contact with the corresponding curved corner portions 251A and 271A of the module package lid 204. The mounting springs 202A and 202B thus each translate the force applied by the mounting screws exclusively onto the plateau portions 250A and 250B of the module package lid 204. Once the mounting screws have fully engaged the respective end portions with substrate 208, the mounting springs 202A and 202B has reached their maximum travel, and the maximum force on each of the plateau portions 250A and 250B is reached because each mounting spring has reached its maximum extension. Indeed, at this point further turning the mounting screw can only de-form the screw hole base of the mounting spring, which is advantageously preferably made of metal which does not easily deform. Further, the curved sections 253A and 273A of the mounting springs 202A and 202B are configured to absorb excess force resulting from over-tightening of the mounting screws in the mounting holes 207A and 208A.

It will be appreciated that certain implementations of the disclosed technology may include only the curved sections 252A and 253A of mounting spring 202A and/or the curved sections 272A and 273A of mounting spring 202B but no corresponding curved portions of the module package lid 204. Other implementations may include the curved corner portions 251A, 254A, 271A, and 274A of the module package lid 204 but no curved sections of the mounting springs 202A and 202B.

Figure 3A:
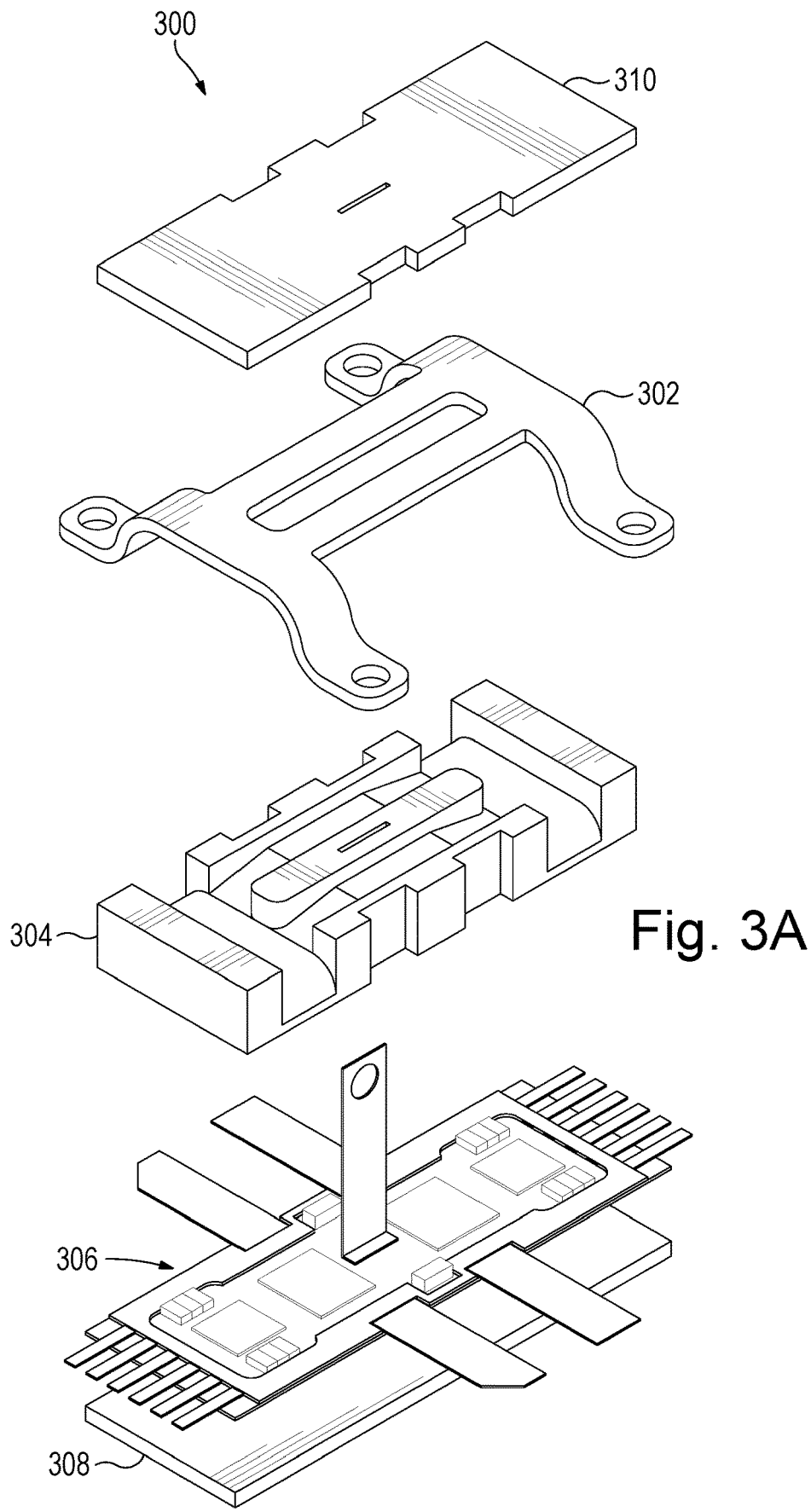
FIG. 3A illustrates a perspective exploded view of another power amplifier having a mounting spring in accordance with certain implementations of the disclosed technology.

FIG. 3A illustrates a perspective exploded view of another power amplifier 300 having a mounting spring 302 in accordance with the disclosed technology. In the example, the power amplifier includes a substrate 308, multiple device components 306 (e.g., integrated circuits (ICs), connecting components, and electrical pathways), a module package lid 304, a cover 310, and the mounting spring 302, which has a middle portion and four leg portions.

Figure 3B:
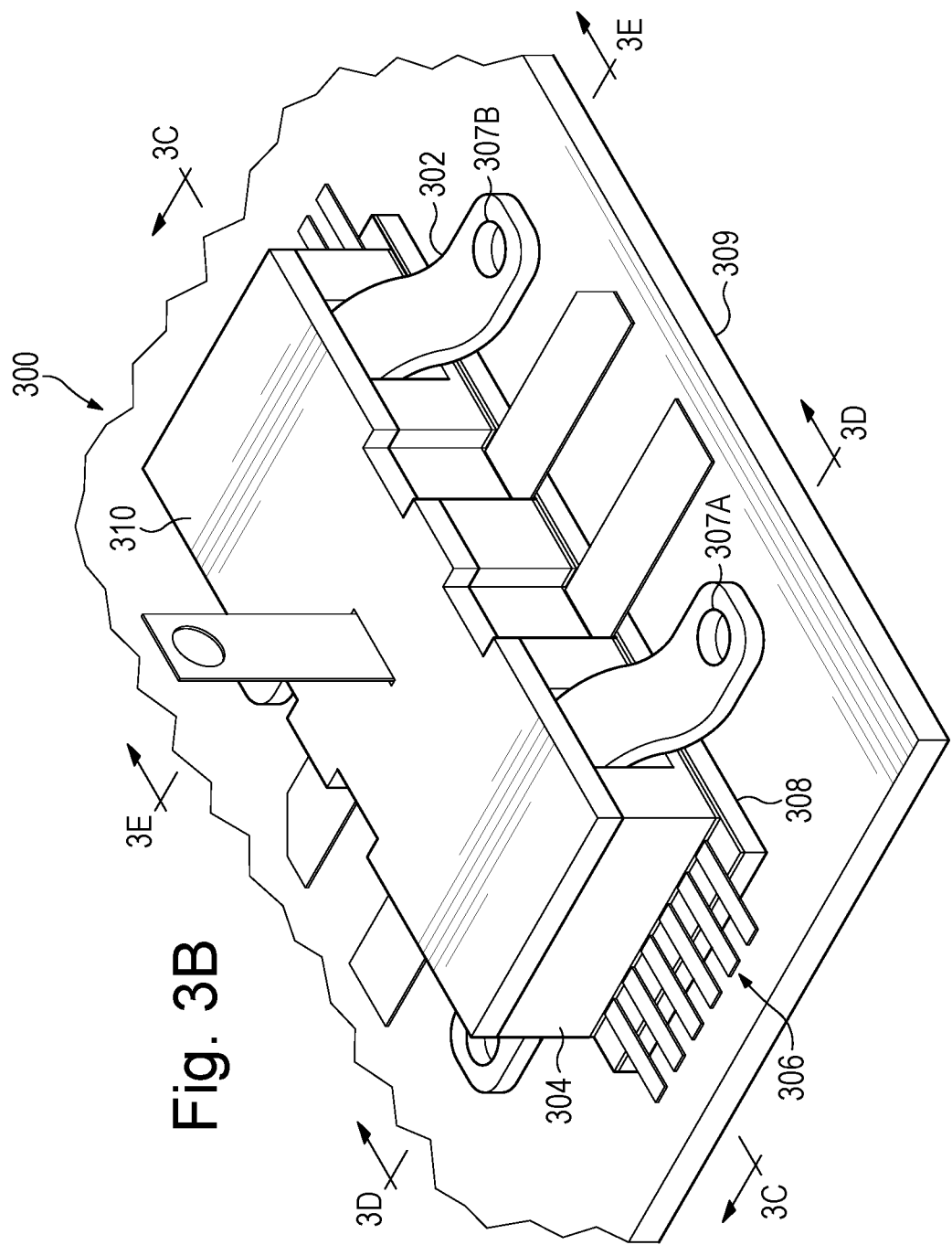
FIG. 3B illustrates a perspective assembled view of the power amplifier of FIG. 3A in accordance with certain implementations of the disclosed technology.

FIG. 3B illustrates a perspective assembled view of the power amplifier 300 of FIG. 3A. In the example, the mounting spring 302 may be coupled with the surface 309 by way of screws (not shown) inserted through mounting holes, such as mounting holes 307A and 307B, in corresponding end portions of the legs of the mounting spring 302, for example. In this manner, the mounting spring 302 advantageously provides the benefits of mounting module packages by screws, e.g., maintaining positioning of the package on a heat sink by preventing lateral movement, as well as the advantages of mounting module packages by clamps, e.g., providing improved mounting pressure on the module package lid 304.

Unlike the mounting springs 202A-B of FIGS. 2A-E, which are separate components, the mounting spring 302 of FIGS. 3A-B is implemented as a single component. Indeed, it will be appreciated that the mounting springs described herein can be designed in virtually any suitable shapes, arrangements, and combinations.

Figure 3C:
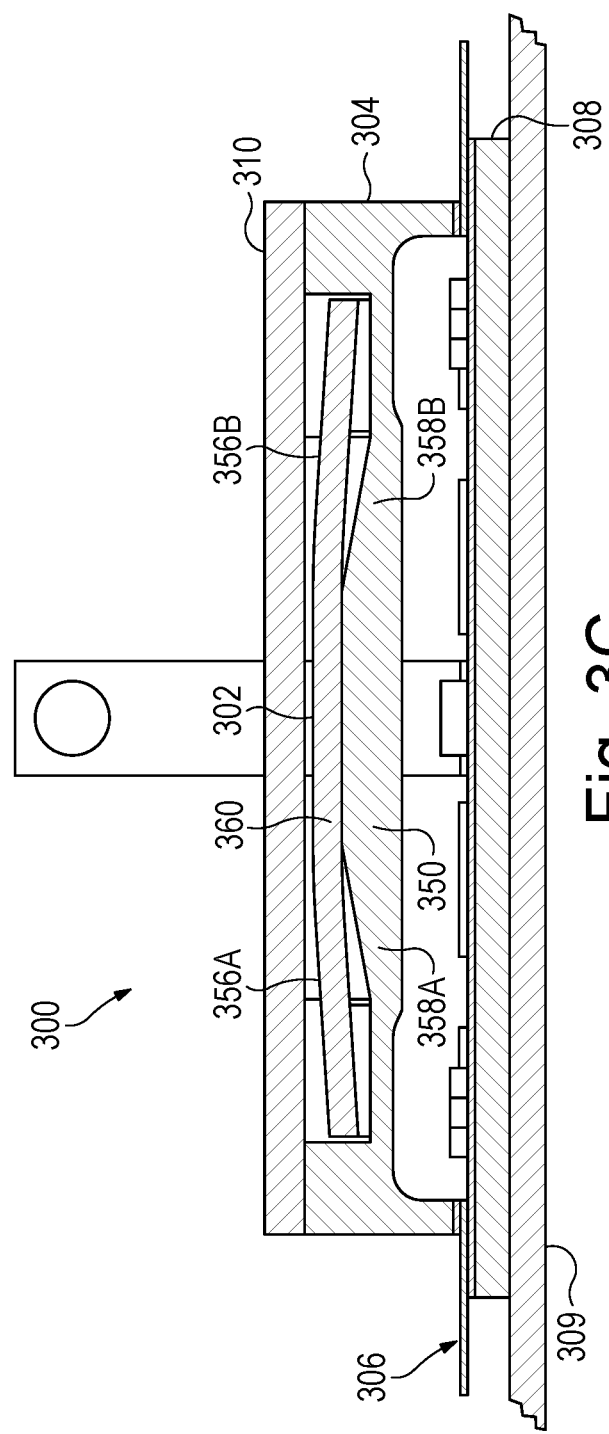
FIG. 3C illustrates a first cross-sectional assembled view of the power amplifier of FIGS. 3A-B in accordance with certain implementations of the disclosed technology.

FIG. 3C illustrates a first cross-sectional assembled view of the power amplifier 300 of FIGS. 3A-B in accordance with certain implementations of the disclosed technology. In the example, the mounting spring 302 has two first curved sections 356A and 356B that each generally slope downward from a middle portion 360 between the two first curved sections 356A and 356B towards a respective edge of the mounting spring closest thereto. The two first curved sections 356A and 356B may also be referred to as stress arches and they are both configured to prevent the mounting spring 302 from engaging with or otherwise coming into contact with two first curved corner portions 358A and 358B of the module package lid 304. The middle portion 360 is arranged to mate with a plateau portion 350 of the module package lid 304 when the end portions of the mounting spring 302 are coupled with the substrate 308. The middle portion 360 may be a valley coupling the two first curve sections 356A and 356B.

Figure 3D:
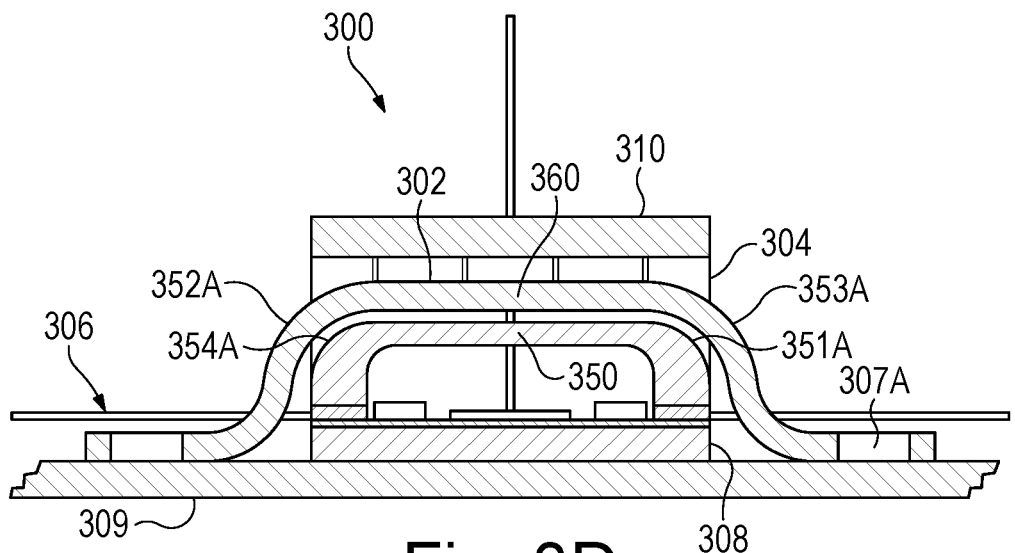
FIG. 3D illustrates a second cross-sectional assembled view of the power amplifier of FIGS. 3A-C in accordance with certain implementations of the disclosed technology.

FIG. 3D illustrates a second cross-sectional assembled view of the power amplifier 300 of FIGS. 3A-C in accordance with certain implementations of the disclosed technology. In the example, the mounting spring 302 has two second curved sections 352A and 353A that each generally slope downward from the middle portion 360 between the two first curved sections 356A and 356B towards a respective edge of the mounting spring closest thereto. The two second curved sections 352A and 353B may also be referred to as stress arches and they are both configured to prevent the mounting spring 302 from engaging with or otherwise coming into contact with two second curved corner portions 351A and 354A of the module package lid 304 when the mounting spring 302 is coupled with the module package lid 304. As noted above, the middle portion 360 of the mounting spring 302 is arranged to mate with the plateau portion 350 of the module package lid 304 when the end portions of the mounting spring 302 are coupled with the substrate 308.

Figure 3E:
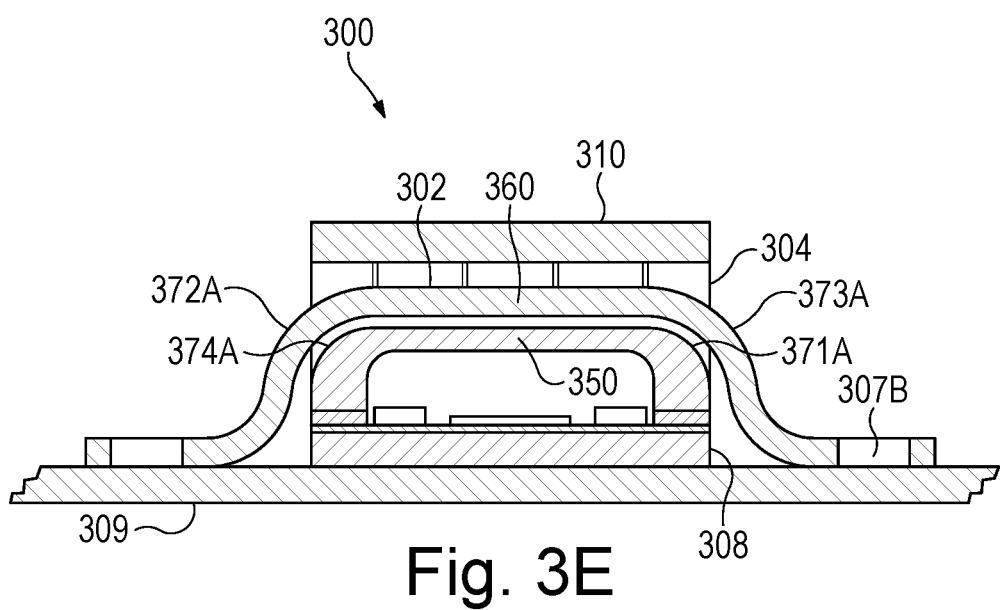
FIG. 3E illustrates a third cross-sectional assembled view of the power amplifier of FIGS. 3A-D in accordance with certain implementations of the disclosed technology.

FIG. 3E illustrates a third cross-sectional assembled view of the power amplifier 300 of FIGS. 3A-D in accordance with certain implementations of the disclosed technology. In the example, the mounting spring 302 has two third curved sections 372A and 373A that that each generally slope downward from the middle portion 360 between the two third curved sections 372A and 373A towards a respective edge of the mounting spring closest thereto. The two third curved sections 372A and 373A may also be referred to as stress arches and they are both configured to prevent the mounting spring 302 from engaging with or otherwise coming into contact with two third curved corner portions 371A and 374A of the module package lid 304 when the mounting spring 302 is coupled with the module package lid 304. As noted above, the middle portion 360 of the mounting spring 302 is arranged to mate with the plateau portion 350 of the module package lid 304 when the end portions of mounting spring 302 are coupled with substrate 308.

As mounting screws are tightened through mounting holes 307A and 307B in the corresponding end portions of the corresponding legs of the mounting spring 302, for example, the force of tightening is first transferred to the middle section 360 of the mourning spring 302 that mates with the plateau section 350 of the module package lid 304. Curved sections 353A and 373A of the mounting spring 302 may expand, contract, and/or absorb the energy resulting from the tightening, thus ensuring that the curved sections 353A and 373A of the mounting spring 302 does not come into contact with the corresponding curved corner portions 351A and 371A of the module package lid 304. The leg portions of the mounting spring 302 thus each translate the force applied by the mounting screws exclusively onto the plateau portion 350 of the module package lid 304. Once the mounting screws have fully engaged the respective end portions with substrate 308, the mounting spring 302 has reached its maximum travel, and the maximum force on the plateau portion 350 of the module package lid 304 is reached because the mounting spring has reached its maximum extension. Indeed, at this point further turning the mounting screw can only de-form the screw hole base of the mounting spring, which is advantageously preferably made of metal which does not easily deform. Further, the curved sections 353A and 373A of the mounting spring 302 are configured to absorb excess force resulting from over-tightening of the mounting screws in the mounting holes 307A and 308A.

While the examples illustrated by FIGS. 2A-E and 3A-E are power amplifiers, the assembly techniques may be adapted for use with virtually any suitable electronic devices/components.

It will be appreciated that the mounting springs disclosed herein may be constructed out of any of a number of suitable materials including, but not limited to, titanium and stainless steel. Stainless steel such as 17-4PH, which is a precipitation-hardened alloy containing approximately 17% chromium, 4% nickel, and 4% copper, may be used to provide an effective compromise between performance and price. Stainless steel alloys, such as 17-4PH, may advantageously have reduced ferromagnetic self-heating in RF applications compared to other suitable materials, such as titanium. In alternative implementations, the mounting springs may be made of a different material such as a graphite composite or other non-metallic material that may have a certain stress strain behavior and wide elastic regions.

Implementations of the disclosed technology generally allow for protective non-linear plateau behavior to occur without reaching the plastic deformation region of the material used for the mounting springs, thus facilitating potential reuse of the mounting springs. Also, by remaining in the elastic region of the material, a compliant stress-strain buffer may be provided as Coefficient of Thermal Expansion (CTE) stresses deform the shape of the module substrate.

During CTE stress cycling, the substrate and other components generally expand and contract in the x, y, and z axes but, when the mounting spring is coupled to the mounting surface, the resultant stress plateau region is maintained in reference to the applied mounting torque but an elastic and linear stress-strain behavior may also be maintained with reference to CTE stresses, e.g., primarily in the z-axis because that is the direction most likely to cause a failure in a ceramic substrate, for example.

Under standard mounting there is routinely delamination of the epoxy-to-lid interface, often severe enough to cause the lid to become completely mechanically detached from the rest of the module assembly. However, because of the compliancy afforded to the entire module by the linear elastic region maintained by the mounting spring in certain embodiments, the overall stress is desirably lowered in the epoxy-to-lid interfaces by limiting major strain behavior to the mounting springs.

Figure 4:
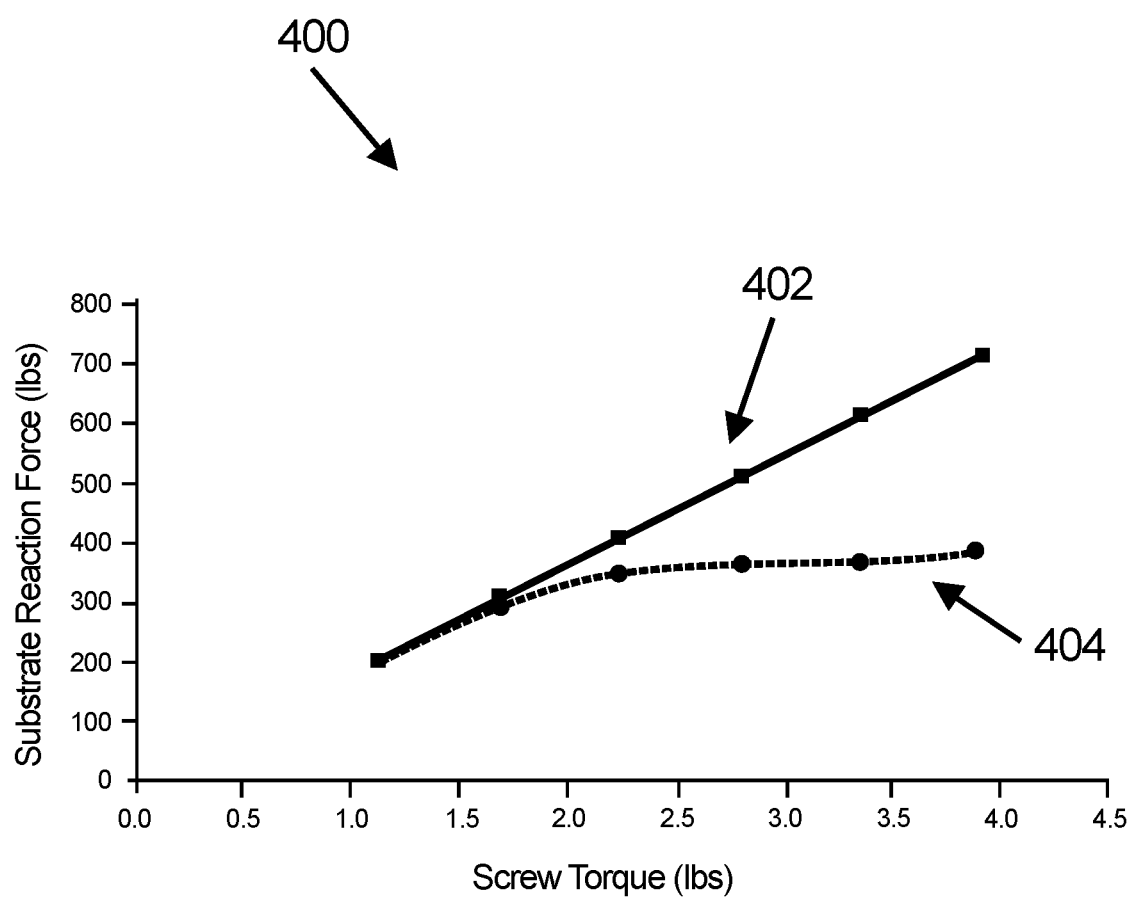
FIG. 4 is a graphical representation of the improvement in screw torque versus substrate reaction force in accordance with certain implementations of the disclosed technology.

FIG. 4 is a graphical representation 400 of the improvement in screw torque versus substrate reaction force in accordance with certain implementations of the disclosed technology. In the example, the graphical representation 400 shows how reaction force increases in a device that includes the use of mounting springs in accordance with the disclosed technology (e.g., plotting 404) as compared to a device that uses simple mounting holes in accordance with conventional techniques (e.g., plotting 402). Whereas overtightening in a conventional design results in a continued increase in the substrate reaction force, the increase in the substrate reaction force in embodiments of the disclosed technology eventually begins to subside during overtightening.

The incorporating of mounting springs into the design of an electronics package as described herein advantageously allows for an even distribution of force across the full area of the substrate, which in turn reduces undesirable plastic deformation of the package. Such force-distribution improvement is accomplished herein by moving the mounting force to the top of the package using the mounting springs, which then apply an even compressive force on the package from above.

Figure 5:
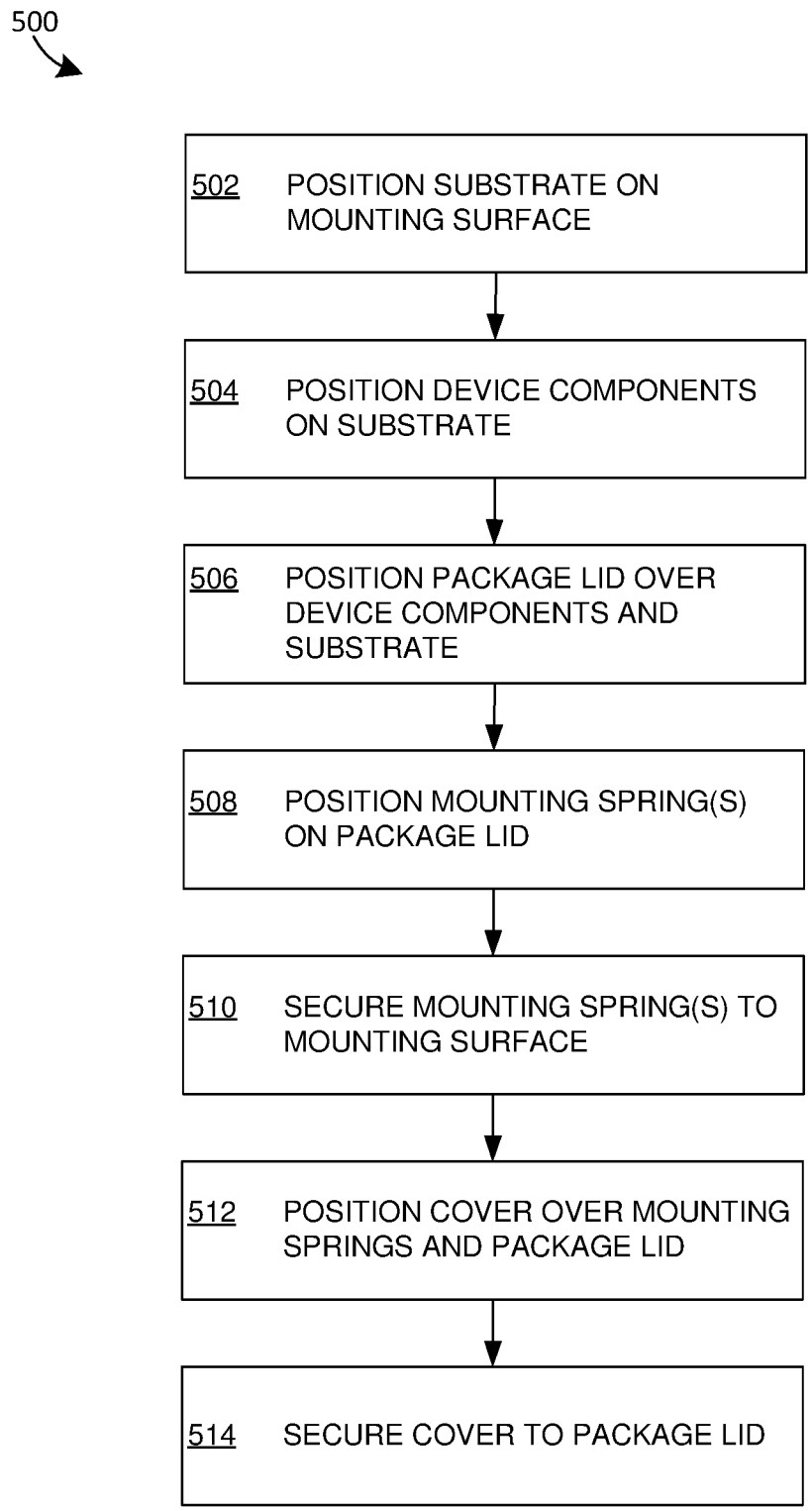
FIG. 5 is a flow diagram illustrating a method of assembling a power module package in accordance with certain implementations of the disclosed technology.

FIG. 5 is a flow diagram illustrating a method 500 of assembling a radio frequency (RF) power module package in accordance with certain implementations of the disclosed technology. At 502, a substrate is mounted on a mounting surface such as a heat sink. In alternative embodiments, the step at 502 may be performed at a different point during the method 500, e.g., after all of the other steps have been performed.

At 504, one or more device components, such as integrated circuits (ICs), connecting components, and electrical pathways, for example, are positioned on the substrate. At 506, a package lid is positioned over the device component(s) and the substrate.

At 508, one or more mounting springs are positioned on the package lid. In certain embodiments, one or more positioning holes in each mounting spring must be aligned with a corresponding positioning pin on the lid to ensure proper horizontal placement of the lid.

In certain embodiments, each mounting spring includes at least one curved section configured to prevent contact with a corresponding corner portion of the module package lid. In other embodiments, the module package lid has curved corner portions configured to prevent contact with the mounting spring(s). In yet other embodiments, each mounting spring includes at least one curved section configured to prevent contact with a corresponding corner portion of the package lid and the package lid has curved corner portions configured to prevent contact with the mounting spring(s).

At 510, the mounting spring(s) are secured to the mounting surface, e.g., by way of one or more mounting screws through mounting holes in corresponding plateau portions of the springs. In alternative embodiments, the step at 510 may be performed at a different point during the method 500, e.g., after all of the subsequent steps have been performed.

At 512, a package cover is positioned over the mounting spring(s) and package lid. At 514, the package cover is secured to the package lid. It will be appreciated that certain implementations may not include either or both of the steps at 512 and 514.

It should be noted that, among the many advantages provided by the method 500, one of them is the general ease of performance. That is, the method 500 does not require a highly-trained assembly technician to perform the steps as virtually anyone able to perform similar tasks can easily perform the method 500.

Having described and illustrated the principles of the invention in a preferred embodiment thereof, it should be apparent that the invention can be modified in arrangement and detail without departing from such principles. We claim all modifications and variations coming within the spirit and scope of the following claims.

The invention claimed is:

1. A module package, comprising: a substrate;
at least one device component configured to be positioned on the substrate;
a module package lid configured to be positioned over the at least one device component and on the substrate, the module package lid exhibiting a plateau portion; and
at least one mounting spring configured to be positioned on the module package lid, wherein the at least one mounting spring is configured to be mechanically coupled with a mounting surface and further positionally secure the module package lid and the at least one device component, each mounting spring having:
a middle portion;
an end portion having a mounting hole; and
a curved section between the middle portion and the end portion, the middle portion arranged to mate with the plateau portion of the module package lid when the end portion is secured to the substrate, the curved section being configured to prevent contact with a first corner portion of the module package lid, the first corner portion of the module package lid being curved to prevent engagement with the at least one mounting spring.

2. The module package of claim 1, further comprising a cover configured to be positioned over the package lid and the at least one mounting spring.

3. The module package of claim 1, wherein the at least one mounting spring is made of stainless steel, titanium, or a non-metallic material.

4. The module package of claim 1, further comprising a mounting screw configured to secure the at least one mounting spring to the mounting surface via the mounting hole.

5. The module package of claim 1, wherein the mounting surface is a heat sink.

6. The module package of claim 1, wherein the package lid plateau includes at least one positioning lid configured to engage with a corresponding positioning hole on each mounting spring.

7. The module package of claim 1, wherein the module package is a radio frequency (RF) power module package.

* * * * *